United States Patent [19]

Hayakawa

[11] Patent Number: 4,933,625
[45] Date of Patent: Jun. 12, 1990

[54] DRIVING CIRCUIT FOR CONTROLLING OUTPUT VOLTAGE TO BE APPLIED TO A LOAD IN ACCORDANCE WITH LOAD RESISTANCE

[75] Inventor: Tatsuo Hayakawa, Tokyo, Japan
[73] Assignee: NEC Corporation, Tokyo, Japan
[21] Appl. No.: 304,728
[22] Filed: Jan. 31, 1989
[30] Foreign Application Priority Data
  Jan. 31, 1988 [JP] Japan .................................. 63-20190
[51] Int. Cl.⁵ ............................................. G05F 1/565
[52] U.S. Cl. .................................... 323/275; 323/277; 323/280
[58] Field of Search ............... 323/273, 274, 275, 277, 323/280, 349, 351

[56] References Cited
U.S. PATENT DOCUMENTS
  3,538,423 11/1970 Goleniewski ........................ 323/275
  4,814,687 3/1989 Walker ................................ 323/275

Primary Examiner—Patrick R. Salce
Assistant Examiner—Jeffrey Sterrett
Attorney, Agent, or Firm—Helfgott & Karas

[57] ABSTRACT

The disclosed driving circuit is composed of a driving transistor connectable to a load in accordance with an input signal, a first control device operating in case of driving the load having a relatively large resistance for producing a first control signal effective to control the driving transistor to drive the load by a constant-voltage type operation, a second control device operating in case of driving the load having a relatively small resistance for producing a second control signal effective to control the driving transistor to drive the load by a constant-current type operation, and a selecting device selectively applying either of the first and second control signals to the driving transistor according to the value of the load resistance connected to the driving transistor.

11 Claims, 6 Drawing Sheets

DRIVING CIRCUIT FOR CONTROLLING OUTPUT VOLTAGE TO BE APPLIED TO A LOAD IN ACCORDANCE WITH LOAD RESISTANCE

BACKGROUND OF THE INVENTION

1. Field of the Invention

The present invention relates to a driving circuit used in a digital communication system and, more particularly, relates to a driving circuit effective to control a peak value of output voltage applied to a load in accordance with an impedance value of the load.

2. Description of the Related Arts

In recent years, in order to spread digital communication network, standardization of interfaces between various types of digital devices has been promoted. According to the plan of Integrated Services Digital Network (ISDN), study and discussion for the standardization have been continued in International Consultative Committee for Telephone and Telegraph (CCITT). Particularly, CCITT recommendation I.430 defines the standardized regulation for the electrical characteristics with regard to "S"-interface. FIG. 9 shows the regulatory characteristic between a peak voltage V2 of transmitting signal and a load resistance $R_L$ across a pair of transformer end terminals according to the CCITT recommendation I.430. In this regulation, the peak voltage V2 must be regulated between the hatched portions of FIG. 9 at respective points of $R_L = 5.6$ Ω, $R_L = 50$ Ω and $R_L = 400$ Ω. More specifically, when $R_L$ equals to 50 Ω, V2 should be regulated within the range of 0.75 V ±10%. When $R_L$ equals to 5.6 Ω, V2 should be regulated below 0.15 V.

In a conventional driving circuit, a transformer was widely used for driving a load. The output voltage across the load may be controlled by its turn ratio of primary and secondary coils or by changing input voltage. However, if those controls are applied to the transformer driver to satisfy the regulation illustrated in FIG. 9, there arise many problems.

For example, when resistance of the load resistor is decreased to 5.6 Ω, the regulation that the transmitted peak voltage should be below 150 mV cannot be satisfied due to the affect of internal resistances $R_P$ and $R_S$ of the primary and secondary coils which cannot be decreased sufficiently. On the other hand, when the load resistance $R_L$ is a relatively large value of 50 Ω or 400 Ω, there is a drawback that the ringing wave is produced during the transitional response of the transformer.

SUMMARY OF THE INVENTION

It is, therefore, a major object of the present invention to provide a driving circuit producing an output of which voltage is controlled in accordance with a load impedance.

It is another object of the present invention to provide a driving circuit which produces a predetermined output voltage even for a relatively small load resistance and without ringing for a relatively large load resistance.

According to the present invention, the driving circuit is comprised of a driving transistor for driving a load in response to an input signal, means for producing a first reference voltage, a first differential amplifier for comparing a voltage across the load and the first reference voltage with each other to amplify and output the difference therebetween, detecting means connected in series to the driving transistor in opposite side relative to the load for detecting a driving current flowing through the load and producing a corresponding detection voltage, means for producing a second reference voltage, a second differential amplifier for comparing the detection voltage and the second reference voltage with each other to amplify and output the difference therebetween, and an adder for adding the outputs of first and second differential amplifiers to each other and feeding the added outputs to an input terminal of the driving transistor to control the driving transistor.

In a preferred embodiment of the present invention, the driving transistor is composed of, for example, a MOS transistor having a source connected with the load and a drain connected with the detecting means.

Further, the voltage across the load can be voltage-divided at a given rate to be fed to one input terminal of the first differential amplifier in place of the whole driving voltage across the load.

In operation of the driving circuit according to the present invention, when the load resistance is relatively large, i.e. the load current is relatively small, the detection voltage produced by the detecting means is smaller than the second reference voltage to make the second differential amplifier produce a high impedance output. Under this condition, the adder supplies the output from the first differential amplifier to the driving transistor. The first differential amplifier operates to equalize the driving voltage across the load to the first reference voltage so as to drive the load by the constant-voltage operation. For this reason, generation of ringing which is produced in a case of using a transformer can be avoided.

On the other hand, when the load resistance is relatively small, i.e., the load current is relatively great, the driving voltage across the load is reduced to saturate the output of first differential amplifier. At the same time, the detection voltage produced by the detecting means is increased to initiate the linear operation of second differential amplifier. By this operation, the driving circuit is switched to the constant-current operation according to the second differential amplifier. Consequently, the internal resistance of the driving circuit becomes very small to have a capability of driving a small load.

Further, in case that the driving transistor is composed of a MOS transistor having a source terminal connected to the load and a drain terminal connected to the detecting means, the output impedance during the constant-voltage driving does not become great to thereby obtain a sharp rising characteristic of driving pulse.

Moreover, in case that the divided voltage of the whole voltage applied to the load is fed to one terminal of the first differential amplifier, the feed-back gain can be advantageously boosted.

BRIEF DESCRIPTION OF THE DRAWINGS

The above and further objects, features and advantages of the present invention will become more apparent from the following detailed description taken in conjunction with the following accompanying drawings, wherein.

DETAILED DESCRIPTION OF THE INVENTION

Figure 1:
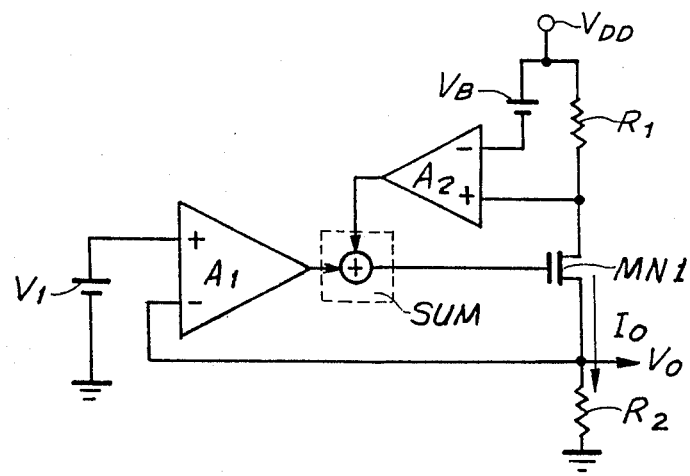
FIG. 1 is a circuit diagram for explaining a principle operation of a first embodiment according to the present invention.

Hereinafter, embodiments of the present invention will be explained in conjunction with the attached drawings. FIG. 1 is a circuit diagram for explaining a principal operation of a driving circuit of first embodiment according to the present invention. In the FIGURE, a driving transistor MN1 is an N-channel metaloxide semiconductor (MOS) transistor which is connected at its source terminal to a load $R_2$ ($R_2$ represents also resistance value of the load) so as to drive the same. A source voltage $V_O$ of the driving transistor MN1, that is a driving voltage applied across the load $R_2$ is applied to an inverting or negative input terminal of a first differential amplifier $A_I$. On the other hand, a non-inverting input terminal of the first differential amplifier $A_I$ is supplied with a first reference voltage $V_I$. The first differential amplifier $A_I$ outputs a voltage-control signal effective to equalize the output voltage $V_O$ applied across the load $R_2$ to the first constant reference voltage $V_I$. This outputted signal is also fed to one terminal of an adder SUM.

On the other hand, a current-detecting resister $R_1$ which functions as an electric current detector is connected between a drain terminal of the driving transistor MN1 and a positive terminal of a power source held at a voltage $V_{DD}$. A voltage drop across the current-detecting resistor $R_1$ is applied to a non-inverting input terminal of a second differential amplifier $A_2$ to compare with the second reference voltage $V_B$. The second differential amplifier $A_2$ outputs a current-control signal effective to regulate the output or load current $I_O$ at a constant level determined according to the second reference voltage $V_B$. This outputted signal is also fed to the other input terminal of adder SUM. An output signal of the adder SUM is fed back to the driving transistor MN1 as a gate-input signal thereof.

Figures 2A, 2B:
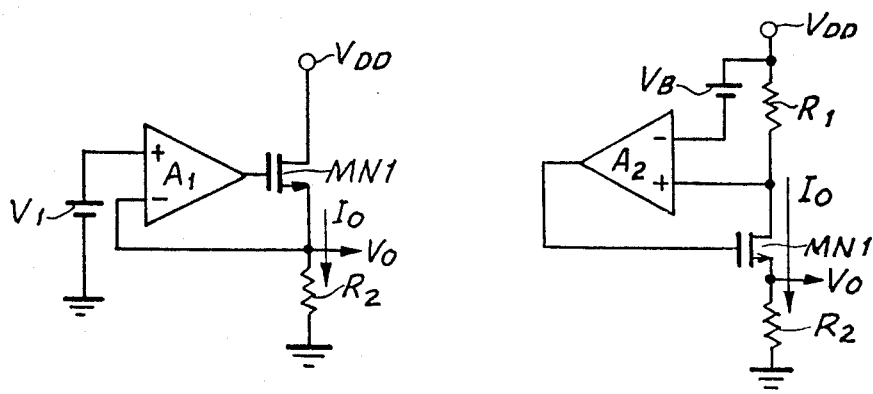
FIG. 2A is an equivalent circuit of FIG. 1 in case of driving a heavy load.
FIG. 2B is another equivalent circuit of FIG. 1 in case of driving a light load.

Next, operation of the driving circuit as constructed above will be explained hereinbelow. Firstly, when the driving or load current $I_O$ is relatively small, i.e., when $V_B > I_O R_1$, the output of second differential amplifier $A_2$ is held at high-impedance beyond the operative linear zone thereof. Consequently, the adder SUM selects the signal from the first differential amplifier $A_1$ to output the same. Accordingly, in such condition, a closed loop containing the first differential amplifier $A_1$ as shown in FIG. 2A effectively operates to control the driving transistor MN1. This closed loop is of voltage-follower connection effective to drive the load $R_2$ with a constant-voltage operation.

Next, when the load $R_2$ is decreased to increase the load current $I_O$ and, therefore, the voltage drop across the current-detecting resister $R_1$ is increased (i.e., $V_B = I_O R_1$), the second differential amplifier $A_2$ starts to operate. When the load $R_2$ is further decreased, the output voltage $V_O$ across the load $R_2$ is decreased. When the decrease amount of voltage $V_O$ is deviated from the operating range of input level of the first differential amplifier $A_1$, the output of first differential amplifier $A_1$ is saturated. As a consequence, only the second differential amplifier $A_2$ carries out linear operation. Stated otherwise, the previous operative closed loop shown in FIG. 2A is switched to a new operative closed loop as shown in FIG. 2B. This new loop is of constant current control effective to regulate the output or load current $I_O$ to a constant current $I_{CO}$ which is represent by the following relation (1).

$$I_{CO} = V_B / R_1 \tag{1}$$

In this condition, the output voltage $V_O$ across the load $R_2$ is proportional to the varying load $R_2$ as indicated by the following relation (2).

$$V_O = V_B \times \frac{R_2}{R_1} \tag{2}$$

Further, a threshold resistance $R_{TH2}$ of the load $R_2$ effective to switch between the constant-voltage driving of closed loop shown in FIG. 2A and the constant-current driving of closed loop shown in FIG. 2B is determined according to the relation (3) and is represented by the relation (4).

$$V_I / R_{TH2} = V_B / R_1 \tag{3}$$

$$R_{TH2} = \frac{V_I}{V_B} \times R_1 \tag{4}$$

Figure 3A:
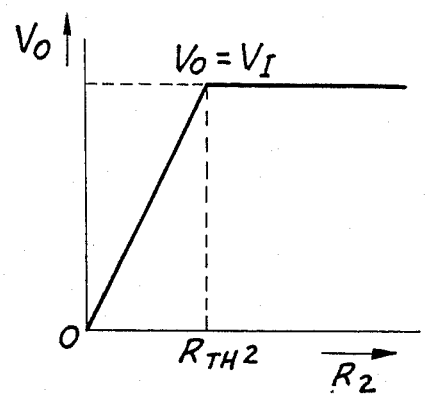
FIG. 3A is a graph showing the characteristic relation of the driving circuit shown in FIG. 1 between the output voltage and the load resistance.
Figure 3B:
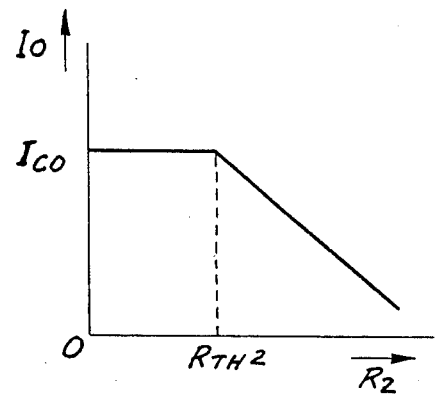
FIG. 3B is a graph showing the characteristic relation of the same driving circuit between the output current and the load resistance.

FIG. 3A shows the relationship between $V_O$ and $R_2$. When $R_2$ is greater than $R_{TH2}$, the constant-voltage driving by the constant reference voltage $V_I$ is selected. When $R_2$ becomes smaller than $R_{TH2}$, the driving voltage $V_O$ is decreased according to the relation (2). FIG. 3B shows the relationship between $I_O$ and $R_2$. When $R_2$ becomes smaller than $R_{TH2}$, the constant-current driving is selected according to the relation (1). Stated otherwise, the driving circuit is switched such that the constant-current driving by means of the second differential amplifier $A_2$ is selected in case of the small load resistance, and the constant-voltage driving by means of the first differential amplifier $A_I$ is selected in case of the great load resistance.

To satisfy the CCITT recommendation I.430, the threshold resistance $R_{TH2}$ is selected as 25 ohms with the current-detecting resistor R1 of 167 ohms, the first reference voltage $V_I$ of 2.1 volts, the second reference voltage $V_B$ of 2.0 volts and the power voltage $V_{DD}$ of 5 volts. Under this circuit condition the above-mentioned driving circuit changes its operating condition from the constant-voltage type to the constant-current type at 25 ohms of the load resistor $R_2$ when the resistance of the load resistor $R_2$ decreases from a large value to a small value.

Figure 4:
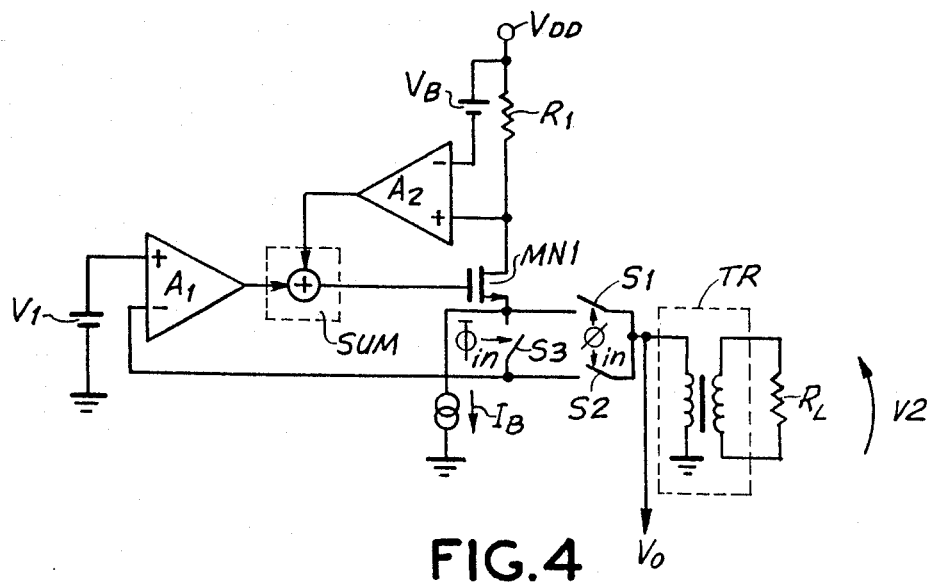
FIG. 4 is a circuit diagram showing a driving circuit of a first embodiment according to the present invention.
Figure 5:
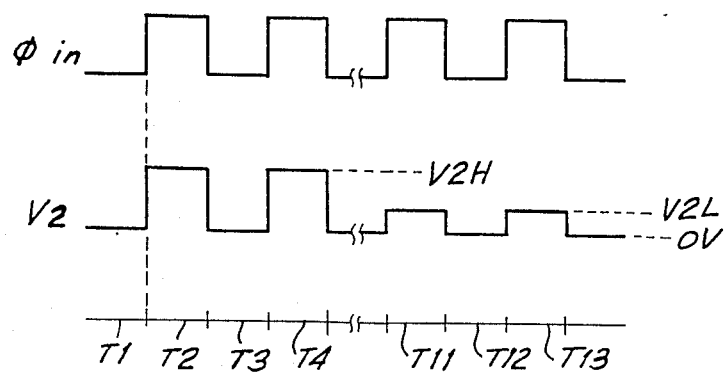
FIG. 5 is a time chart illustrating the operation of the circuit shown in FIG. 4.

Next, FIG. 4 shows a practical embodiment of the driving circuit of the first embodiment shown in FIG. 1, in which a transformer T1 is driven by the driving circuit. FIG. 5 is a timing chart of FIG. 4. A plurality of switches S1, S2 and S3 are provided to selectively connect the driving circuit and an additional current source which produces an idling current $I_B$ to the transformer TR in response to an input signal $\phi_{in}$. The idling current $I_B$ is set to satisfy the relation $I_B < I_{CO}$. When the signal $\phi_{in}$ is held at the high level, the switches S1 and S2 are turned on and the switch S3 is turned off so that the driving circuit according to the present invention drives the transformer TR. When the signal $\phi_{in}$ is held at the low level, the switches S1 and S2 are turned off and the switch S3 is turned on so that the driving circuit is cut from the transformer TR. During successive driving intervals T1–T4, a load resistance $R_L$ between secondary winding end terminals of the transformer TR has a relatively great value. Thus, the secondary winding outputs a voltage V2H which is determined by dividing the reference voltage $V_I$ by the turns ratio n of transformer TR. In this embodiment, since the current detecting resistor $R_1$ is not connected to the source terminal of driving transistor MN1, but is connected to the drain terminal of driving transistor MN1, the output impedance does not increase during the constant-voltage driving. Accordingly, a sharp rising characteristic of driving pulse can be obtained to thereby enable a high speed data transfer of, for example, 192KBPS.

On the other hand, during the following successive driving intervals T11–T13, the load resistance $R_L$ is sufficiently small so that the transformer TR outputs a voltage V2L which is determined by multiplying $R_L$ by n-times of the constant-current value $I_{CO}$ according to the following relation (5).

$$V2L = I_{CO} \times n \times R_L \quad (5)$$

Under this condition, since the driving circuit effects the constant-current driving with its small output resistance.

Figure 6:
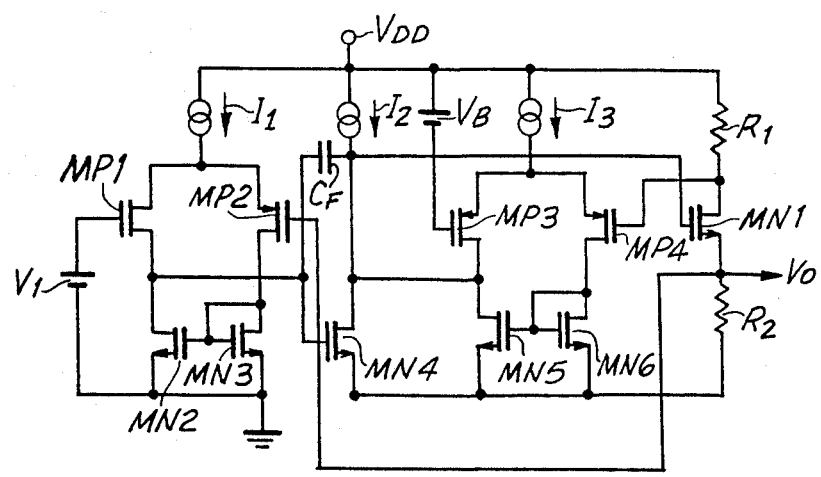
FIG. 6 is a circuit diagram in which the driving circuit of FIG. 1 is composed of CMOS transistors.
Figure 9:
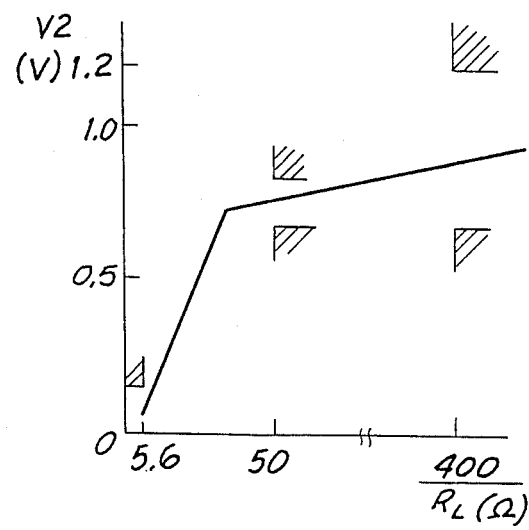
FIG. 9 is a chart showing the regulatory relation between the voltage amplitude of driving pulse and the load resistance according to the CCITT recommendation I.430.

FIG. 6 shows a concrete circuit diagram of the driving circuit composed of complimentary metal oxide semiconductor (CMOS) transistors. In the FIGURE, $I_1$–$I_3$ indicate constant current sources. P-channel MOS transistors MP1 and MP2 and N-channel MOS transistors MN2, MN3 and MN4 constitute the first differential amplifier $A_1$, other P-channel MOS transistors MP3 and MP4 and N-channel MOS transistors MN5 and MN6 constitute the second differential amplifier $A_2$, and further, drain terminals of the MOS transistors MN4 and MN5 constitute the adder SUM. This adder SUM controls the gate of driving transistor MN1 (N-channel MOS transistor). In addition, a capacitor $C_F$ is provided to compensate the phase of first differential amplifier $A_1$.

Figure 7:
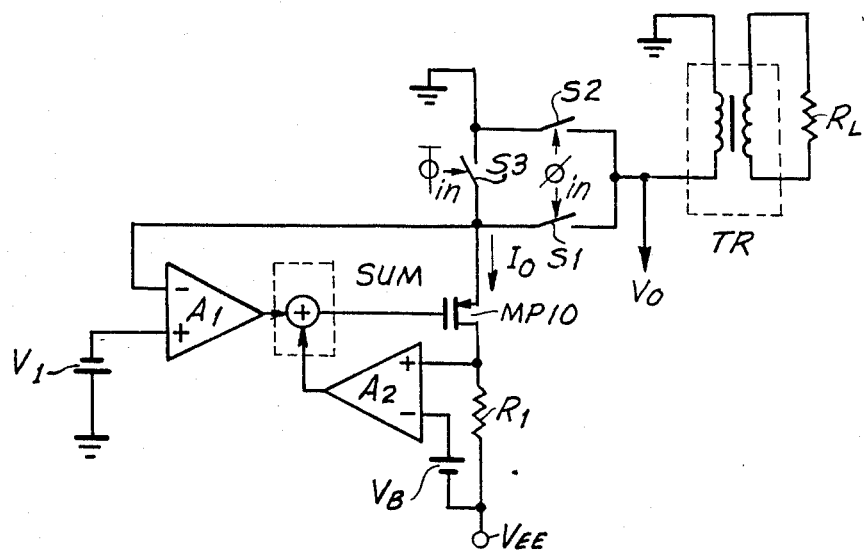
FIG. 7 is a circuit diagram showing a second embodiment of the present invention.

FIG. 7 is a circuit block showing a second embodiment of the present invention. In this embodiment, the potential level of output voltage $V_O$ is negative with respect to the ground level and the output current $I_O$ is drawn through the primary winding of a transformer TR. Consequently, in this case, the driving MOS transistor MP10 is composed of the P-channel type.

Figure 8:
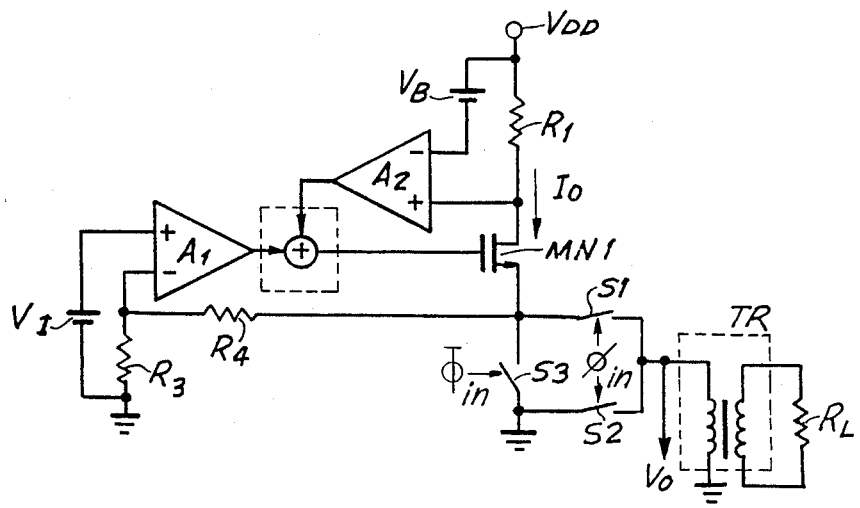
FIG. 8 is a circuit diagram showing a third embodiment of the present invention.

Further, FIG. 8 is a circuit diagram showing a third embodiment of the present invention. In this embodiment, the feed-back input voltage to the inverting-input terminal of a first differential amplifier $A_1$ is voltage-divided by resistors $R_3$ and $R_4$ as opposed to the first and second embodiments, hence the first differential amplifier $A_1$ has a feed-back gain Avf represented by the following relation (6).

$$Avf = 1 + R_4/R_3 \quad (6)$$

the general operation of these second and third embodiments is the same as that of the first embodiment shown in FIGS. 1 to 6, and therefore the detailed description of operation is omitted.

It should be noted that the present invention is not limited to the circuitry composed of CMOS transistors, but the circuitry can be composed of bipolar transistors.

As described above, according to the present invention, the constant-voltage driving is selected in case of relatively large-resistance load driving so as to avoid the generation of ringing in the output, and the constant-current driving is selected in case of relatively small-resistance load driving so as to have a sufficient output voltage. Accordingly, the driving circuit according to the present invention can stably operate to satisfy the required standard of operation range.

What is claimed is:

1. A driving circuit for driving a load having either of large and small resistance, comprising: driving means connectable to a load for driving the same, said driving means including a driving transistor, a switch controlled by an input signal and a transformer having a primary winding connected to said driving transistor through said switch and a secondary winding connected to said load; first control means being operative in case of said load having a relatively large resistance for producing a first control signal effective to control said driving means to drive said load by a constant voltage; second control means being operative in case of said load having a relatively small resistance for producing a second control signal effective to control said driving means to drive said load by a constant current; and selecting means for selectively applying either of said first and second control signals to said driving means according to the value of load resistance connected to said driving circuit.

2. A driving circuit according to claim 1; wherein said selecting means includes an adder for adding said first and second control signals to each other to apply the added signals to said driving means.

3. A driving circuit according to claim 1; wherein said first control means includes a first differential amplifier having an inverting input terminal receptive of a driving voltage applied across said load and a non-inverting input terminal receptive of a first given reference voltage to amplify the difference therebetween to thereby produce said first control signal.

4. A driving circuit according to claim 3; wherein said first control means includes means for voltage-dividing the voltage at a connection point between said driving transistor and said switch at a given rate to apply the voltage-divided voltage to said inverting input terminal.

5. A driving circuit according to claim 1; wherein said second control means includes detecting means for detecting a driving current flowing through said load and producing a corresponding detection voltage, and a second differential amplifier having an inverting input terminal receptive of a second given reference voltage and a non-inverting input terminal receptive of said detection voltage to amplify the difference therebetween to thereby produce said second control signal.

6. A driving circuit according to claim 5, wherein said driving transistor has one output terminal connectable to said switch and the other output terminal connected to said detecting means, said detecting means, said driving transistor and said switch being connected in series.

7. A driving circuit according to claim 6; wherein said driving transistor comprises a MOS transistor having a drain output terminal connected to said detecting means.

8. A driving circuit comprising: a driving transistor for driving a load in response to an input signal, said load being connected in series to a first side of said driving transistor; first means for producing a first reference voltage; a first differential amplifier having a non-inverting input terminal receptive of said first reference voltage produced by said first means and an inverting input terminal receptive of an output voltage obtained from said driving transistor to be applied to said load; current detecting means connected in series to a second side of said driving transistor opposite to said first side thereof, said current detecting means detecting a current flowing through said driving transistor; second means for producing a second reference voltage; a second differential amplifier having an inverting input terminal receptive to said second reference voltage produced by said second means and a non-inverting input terminal receptive of a detected voltage produced by said current detecting means; and an adder for adding outputs from said first and second differential amplifiers to each other to output the added voltages as a control signal effective to control said driving transistor.

9. A driving circuit according to claim 8; wherein said load is connected to said driving transistor through a switch the switching operation of which is controlled by said input signal.

10. A driving circuit according to claim 9; wherein said driving transistor comprises a MOS transistor having a drain terminal connected to said current detecting means and a source terminal connected to said switch.

11. A driving circuit according to claim 9; further including means for voltage-dividing the voltage at a circuit portion connecting said driving transistor and said switch at a given rate to apply the voltage-divided driving voltage to said inverting input terminal of said first differential amplifier.

* * * * *